(12) United States Patent
Hyun et al.

(10) Patent No.: US 11,758,752 B2
(45) Date of Patent: Sep. 12, 2023

(54) FOLDABLE DISPLAY APPARATUS

(71) Applicant: LG Display Co., Ltd., Seoul (KR)

(72) Inventors: KwangMin Hyun, Daegu (KR);
Hyeonyeong Lee, Sejong-si (KR)

(73) Assignee: LG Display Co., Ltd., Seoul (KR)

( * ) Notice: Subject to any disclaimer, the term of this patent is extended or adjusted under 35 U.S.C. 154(b) by 209 days.

(21) Appl. No.: 17/401,307

(22) Filed: Aug. 12, 2021

(65) Prior Publication Data
US 2022/0209165 A1    Jun. 30, 2022

(30) Foreign Application Priority Data
Dec. 31, 2020 (KR) .................. 10-2020-0189493

(51) Int. Cl.
*H10K 50/84* (2023.01)
*H10K 59/35* (2023.01)
*H10K 102/00* (2023.01)

(52) U.S. Cl.
CPC ......... *H10K 50/841* (2023.02); *H10K 59/353* (2023.02); *H10K 2102/311* (2023.02)

(58) Field of Classification Search
CPC .... H10K 50/868; H10K 50/86; H10K 50/841; H10K 59/8793; H10K 59/878; H10K 59/879; H10K 77/111; H10K 2102/311; G06F 1/1641; G06F 1/1652; G09F 9/301
See application file for complete search history.

(56) References Cited

U.S. PATENT DOCUMENTS

| | | | | |
|---|---|---|---|---|
| 9,429,999 | B2* | 8/2016 | Lee | G06F 1/1652 |
| 10,020,462 | B1* | 7/2018 | Ai | H10K 50/841 |
| 10,429,895 | B2* | 10/2019 | Lee | G06F 1/1643 |
| 11,387,282 | B2* | 7/2022 | Choi | H10K 50/11 |
| 11,412,625 | B2* | 8/2022 | Kim | H05K 5/0017 |
| 11,469,395 | B2* | 10/2022 | Luo | H10K 50/841 |
| 11,508,268 | B2* | 11/2022 | Lee | G09F 9/301 |
| 2015/0049428 | A1* | 2/2015 | Lee | G06F 1/1652 |
| | | | | 361/679.27 |
| 2016/0048171 | A1* | 2/2016 | Lee | G06F 1/1652 |
| | | | | 361/679.27 |
| 2016/0062018 | A1* | 3/2016 | Namkung | G02B 5/3083 |
| | | | | 359/489.07 |
| 2016/0226017 | A1* | 8/2016 | Nam | H10K 50/8426 |
| 2016/0252665 | A1* | 9/2016 | Lee | G02B 1/14 |
| | | | | 359/489.07 |
| 2017/0162821 | A1* | 6/2017 | Oh | H10K 59/12 |
| 2017/0262022 | A1* | 9/2017 | Choi | G02B 5/3083 |

(Continued)

FOREIGN PATENT DOCUMENTS

| KR | 10-2017-0060727 A | 6/2017 |
|---|---|---|
| KR | 10-2018-0036304 A | 4/2018 |

(Continued)

*Primary Examiner* — Sophia T Nguyen
(74) *Attorney, Agent, or Firm* — SEED IP LAW GROUP LLP

(57) ABSTRACT

A foldable display apparatus comprises a display panel including a folding area and a non-folding area at one or more sides of the folding area; and a cover window on the display panel. The cover window includes a glass substrate including a plurality of patterns at the folding area, and a protective layer between the glass substrate and the display panel. Each of the plurality of patterns includes a plurality of protrusions.

27 Claims, 5 Drawing Sheets

(56) References Cited

U.S. PATENT DOCUMENTS

| | | | |
|---|---|---|---|
| 2017/0294495 A1* | 10/2017 | Shyu | G06F 3/041 |
| 2018/0013080 A1* | 1/2018 | Kim | H10K 50/87 |
| 2018/0096635 A1* | 4/2018 | Park | H10K 50/844 |
| 2018/0210266 A1* | 7/2018 | Lius | H10K 50/8445 |
| 2018/0287095 A1* | 10/2018 | Namkung | H10K 59/805 |
| 2018/0321708 A1* | 11/2018 | Wu | G06F 3/0443 |
| 2019/0036068 A1* | 1/2019 | Kim | H10K 59/87 |
| 2019/0204867 A1* | 7/2019 | Song | G06F 1/1641 |
| 2019/0204872 A1* | 7/2019 | Lee | G06F 1/1641 |
| 2019/0204873 A1* | 7/2019 | Kim | G06F 1/1652 |
| 2019/0305256 A1* | 10/2019 | Wu | G02F 1/133 |
| 2019/0346887 A1* | 11/2019 | Park | G06F 1/1681 |
| 2019/0384363 A1* | 12/2019 | Lee | G06F 1/1652 |
| 2020/0105169 A1* | 4/2020 | Jeong | H10K 50/844 |
| 2020/0280005 A1* | 9/2020 | Fang | G09F 9/30 |
| 2020/0328382 A1* | 10/2020 | Lee | H10K 50/854 |
| 2020/0344897 A1* | 10/2020 | Kim | G06F 1/1641 |
| 2020/0371551 A1* | 11/2020 | Kim | G06F 1/1637 |
| 2021/0090475 A1* | 3/2021 | Wang | G06F 1/1656 |
| 2021/0111357 A1* | 4/2021 | Kawaguchi | G02F 1/1335 |
| 2021/0118337 A1* | 4/2021 | Park | G09F 9/301 |
| 2021/0150944 A1* | 5/2021 | Yoon | G06F 1/1618 |
| 2021/0282279 A1* | 9/2021 | Min | B32B 27/08 |
| 2021/0337686 A1* | 10/2021 | Sim | H04M 1/0268 |
| 2021/0373604 A1* | 12/2021 | Shin | G06F 1/1652 |
| 2021/0407344 A1* | 12/2021 | Lee | H10K 59/131 |
| 2021/0408406 A1* | 12/2021 | Hu | H10K 59/12 |
| 2022/0011813 A1* | 1/2022 | Kim | G06F 1/1656 |
| 2022/0093012 A1* | 3/2022 | Lee | G09F 9/301 |
| 2022/0103670 A1* | 3/2022 | Liao | H04M 1/0216 |
| 2022/0201879 A1* | 6/2022 | Kwak | H05K 5/0217 |
| 2022/0209165 A1* | 6/2022 | Hyun | H10K 50/841 |
| 2022/0263050 A1* | 8/2022 | Roh | H10K 50/844 |
| 2022/0293870 A1* | 9/2022 | Park | H10K 77/111 |
| 2022/0376201 A1* | 11/2022 | Kim | H10K 71/00 |
| 2022/0404876 A1* | 12/2022 | Kim | G06F 1/1656 |

FOREIGN PATENT DOCUMENTS

| | | |
|---|---|---|
| KR | 10-2018-0079093 A | 7/2018 |
| KR | 10-2019-0123428 A | 11/2019 |
| KR | 10-2146730 B1 | 8/2020 |

* cited by examiner

FOLDABLE DISPLAY APPARATUS

CROSS-REFERENCE TO RELATED APPLICATIONS

This application claims the benefit of and priority to Korean Patent Application No. 10-2020-0189493 filed on Dec. 31, 2020, in the Republic of Korea, the entire contents of which are hereby expressly incorporated by reference into the present application.

BACKGROUND

Technical Field

The present disclosure relates to a foldable display apparatus.

Discussion of the Related Art

Recently, as our society advances toward an information-oriented society, the field of display apparatuses for processing and displaying a large amount of information has rapidly advanced. Display apparatuses used in computer monitors, TVs, and mobile phones include organic light emitting display (OLED) apparatuses that emit light by themselves, and liquid crystal display (LCD) apparatuses that require a separate light source.

Such display apparatuses are being applied to more and more various fields including not only computer monitors and TVs, but also personal mobile apparatuses, and thus, display apparatuses having a reduced volume and weight while having a wide display area are being studied.

In recent years, a flexible display apparatus that is manufactured to display an image even when it is bent or folded like paper has received attention as a next-generation display apparatus. Flexible display apparatuses may be classified into highly durable and unbreakable types, bendable types without breakage, rollable types, foldable types, and the like, by using a plastic thin film transistor substrate, instead of glass. Such a flexible display apparatus may have advantages in terms of space utilization, interior and design.

BRIEF SUMMARY

One or more embodiments of the present disclosure provide a foldable display apparatus capable of having resistance to external impacts by dispersing the impacts that are applied to a folding area, and capable of improving rigidity in the folding area.

Further embodiments of the present disclosure provide a foldable display apparatus with improved product reliability by preventing a user from visually recognizing a boundary area between a folding area and a non-folding area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to an embodiment of the present disclosure, a foldable display apparatus comprises a display panel including a folding area and a non-folding area at one or more sides of the folding area, and a cover window on the display panel, The cover window includes a glass substrate including a plurality of patterns at the folding area and a protective layer between the glass substrate and the display panel. Each of the plurality of patterns includes a plurality of protrusions.

According to an embodiment of the present disclosure, a foldable display apparatus comprises a display panel including a display area having a plurality of sub-pixels, a non-display area adjacent to the display area, a folding area in the display area and the non-display area, and a non-folding area at one or more sides of the folding area, and a cover window at the display panel. The cover window comprises a substrate including a plurality of grooves at the folding area, a plurality of patterns at the plurality of grooves, the plurality of patterns corresponding to the plurality of grooves, and a plurality of protrusions on each of the plurality of patterns.

According to an embodiment of the present disclosure, a foldable display apparatus comprises a display panel divided into a display area having a plurality of sub-pixels and a non-display area adjacent to the display area, and also divided into a folding area across the display area and the non-display area, and a non-folding area at one or more sides of the folding area, and a cover window on the display panel. The cover window comprises a glass substrate including a plurality of grooves at the folding area, a plurality of patterns at the plurality of grooves, and a protective layer between the glass substrate and the display panel. Each of the plurality of patterns includes a plurality of protrusions.

According to an embodiment of the present disclosure, a plurality of patterns may be disposed at a folding area of a cover window, whereby an impact applied to the folding area may be distributed.

According to an embodiment of the present disclosure, rigidity characteristics against external impacts at the folding area may be improved.

According to an embodiment of the present disclosure, when external light is reflected by a pattern including a plurality of protrusions, a diffused reflection effect due to scattering of reflected external light increases, and it is possible to prevent a boundary area between a glass substrate and the pattern from being visually recognized by a user, thereby allowing for improvements in product completeness and/or product reliability.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
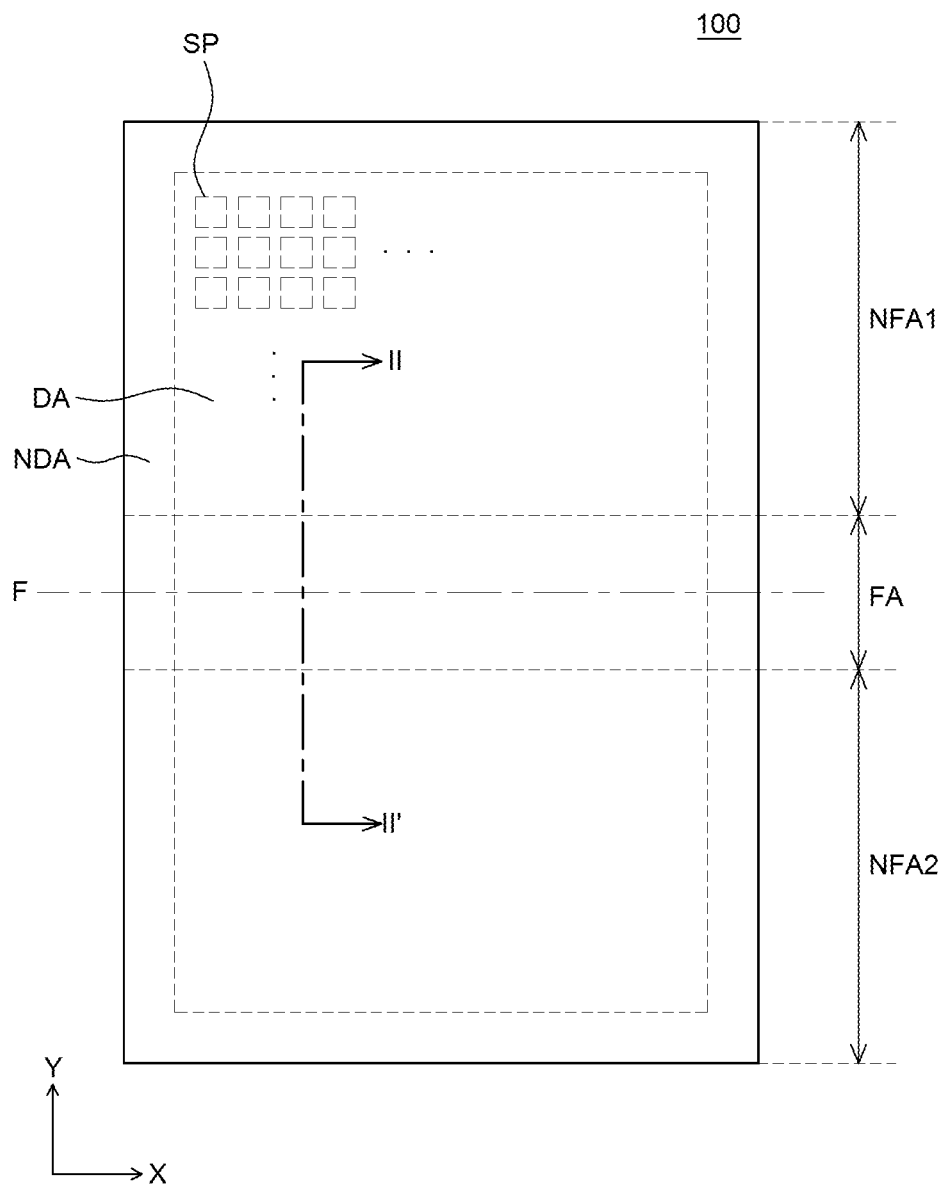
FIG. 1 is a plan view of a foldable display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

A size and a thickness of each component illustrated in the drawing are illustrated for convenience of description, and the present disclosure is not limited to the size and the thickness of the component illustrated.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the present disclosure will be described in detail with reference to accompanying drawings.

Figure 2:
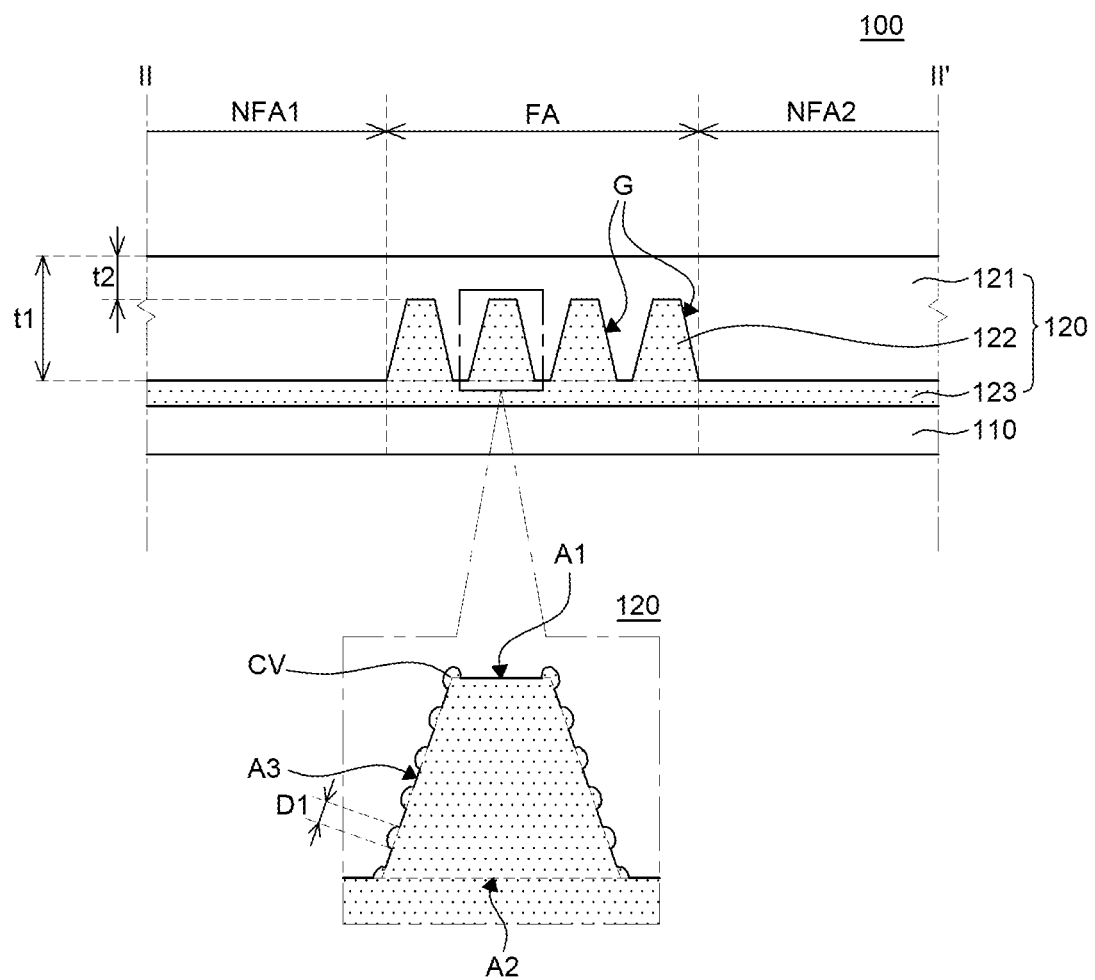
FIG. 2 is a cross-sectional view of the foldable display apparatus, taken along line II-II' of FIG. 1.
Figure 3:
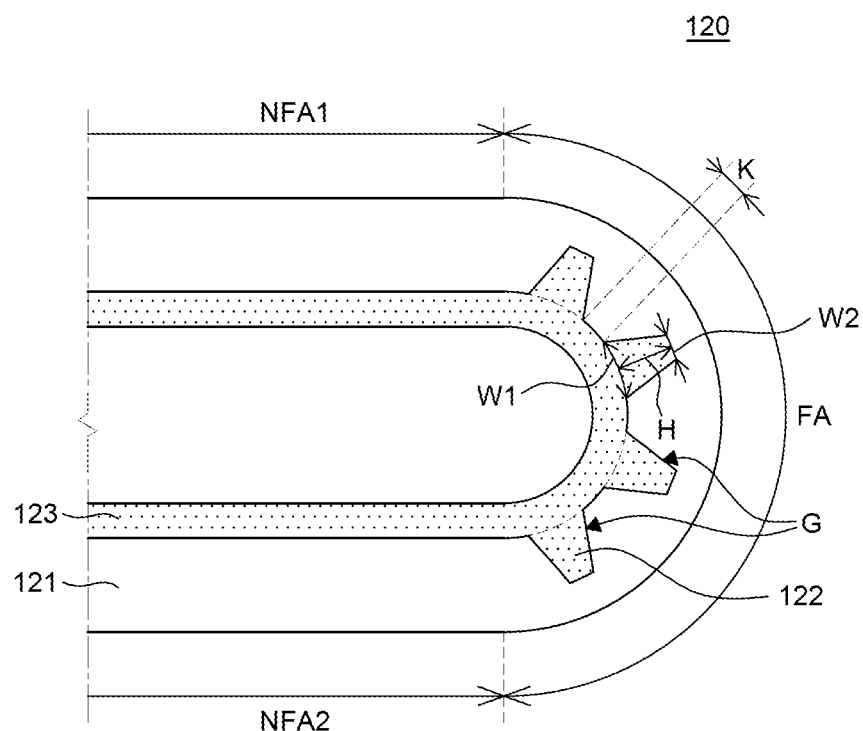
FIG. 3 is a side view illustrating a form in which a cover window included in the foldable display apparatus according to an embodiment of the present disclosure is folded inwardly.

FIG. 1 is a plan view of a foldable display apparatus according to an embodiment of the present disclosure. FIG. 2 is a cross-sectional view of the foldable display apparatus, taken along line II-II' of FIG. 1. FIG. 3 is a side view illustrating a form in which a cover window of FIG. 2 is folded inwardly.

With reference to FIGS. 1 and 2, a foldable display apparatus 100 according to an embodiment of the present disclosure includes a display panel 110 and a cover window 120. Hereinafter, for convenience of description, it is assumed that the foldable display apparatus 100 according to an embodiment of the present disclosure is an organic light emitting display apparatus, but an embodiment of the present disclosure is not limited thereto.

The display panel 110 of the foldable display apparatus 100 includes a display area DA and a non-display area NDA. Also, the display panel 110 includes a folding area FA and non-folding areas NFA1 and NFA2. The display panel 110 may be divided into a display area DA and a non-display area NDA depending on whether or not an image is displayed, and may be divided into a folding area FA and non-folding areas NFA1 and NFA2 on both sides of the folding area FA depending on whether or not the area is folded.

The display area DA is an area where a plurality of pixels is disposed to substantially display an image. In the display area DA, a plurality of pixels including a light emitting area for displaying an image, thin film transistors for driving the pixels, and capacitors may be disposed. One pixel may include a plurality of sub-pixels SP. The sub-pixel SP can be a minimum unit constituting the display area, and each sub-pixel SP may be configured to emit light of a specific wavelength band. For example, each sub-pixel SP may be configured to emit red, green, blue, or white light.

The non-display area NDA is disposed to be adjacent to the display area DA. In some embodiments, the non-display area NDA may surround the display area DA. The non-display area NDA is an area where an image is not substantially displayed, and various lines, driver ICs and printed circuit boards and the like for driving the pixels and driving circuits disposed in the display area DA are disposed at the non-display area NDA. For example, various ICs such as a gate driver IC and a data driver IC, and lines may be disposed at the non-display area NDA.

In some embodiments, the display panel 110 may be defined as a folding area FA and non-folding areas NFA1 and NAF2 depending on whether or not the area is folded. The display panel 110 according to an embodiment of the present disclosure includes a first non-folding area NFA1, a folding area FA, and a second non-folding area NFA2 that are sequentially positioned in a direction perpendicular to a folding axis F of the folding area FA, for example, in a Y-axis direction.

The folding area FA is an area that is folded when the foldable display apparatus 100 is folded, and may include a part of the display area DA and a part of the non-display areas NDA. The folding area FA may be folded according to a specific radius of curvature in the direction perpendicular to the folding axis F of the folding area FA, for example, in the Y-axis direction of FIG. 1. When the folding area FA is folded in the direction perpendicular to the folding axis F, the folding area FA may form a part of a circle or an ellipse. The radius of curvature of the folding area FA may be a radius corresponding to a part of a circle or an ellipse formed by the folding area FA.

The first non-folding area NFA1 and the second non-folding area NFA2 are areas that are not folded when the foldable display apparatus 100 is folded. For example, each of the first non-folding area NFA1 and the second non-folding area NFA2 may be an area that maintains a flat state when the foldable display apparatus 100 is folded. Each of the first non-folding area NFA1 and the second non-folding area NFA2 may include a part of the display area DA and a part of the non-display area NDA. When the folding area FA is folded in a folding direction, the first non-folding area NFA1 and the second non-folding area NFA2 may overlap each other.

The display panel 110 is a panel on which an image is implemented, and display elements for implementing an image and a circuit unit for driving the display elements may be disposed. For example, when the foldable display apparatus 100 is an organic light emitting display apparatus, the display element may include an organic light emitting element.

The circuit part may include various thin film transistors, capacitors, lines, and driver ICs for driving the organic light emitting element. For example, the circuit part may include various components such as a driving thin film transistor, a switching thin film transistor, a storage capacitor, a gate line, a data line, a gate driver IC, and a data driver IC, but is not limited thereto.

In the display panel 110, a flexible substrate on which the driving thin film transistor and light emitting elements are formed may be encapsulated by an encapsulation layer. For example, a touch panel, a polarization layer and the like may be further disposed on the encapsulation layer, but embodiments of the present disclosure are not limited thereto.

To implement flexibility, the display panel 110 includes a flexible substrate having a very small thickness and display elements disposed on the flexible substrate.

The flexible substrate may be formed of an insulating material having flexibility and for example, it may be an insulating plastic substrate which is one of polyimide, polyethersulfone, polyethylene terephthalate, and polycarbonate, but is not limited thereto.

In the case of a plastic substrate, since a barrier characteristic thereof to moisture or oxygen is relatively low, it may have a structure in which a plastic film and an inorganic film are stacked to compensate for the barrier characteristic. For example, the flexible substrate may include a multilayer structure in which a first plastic film, an inorganic film, and a second plastic film are sequentially stacked, but embodiments of the present disclosure are not limited thereto.

The driving thin film transistor for driving the display element may be disposed on the flexible substrate. The driving thin film transistor may be disposed at each of the plurality of pixel areas. For example, the driving thin film transistor includes a gate electrode, an active layer, a source electrode, and a drain electrode. In addition, the driving thin film transistor may further include a gate insulating layer for insulating the gate electrode and the active layer, and may further include an interlayer insulating layer for insulating the gate electrode from the source electrode and the drain electrode. A planarization layer may be disposed on the driving thin film transistor to flatten an upper surface thereof. The display elements may be disposed on the planarization layer. The display element may be an organic light emitting element. The organic light emitting element may include an anode, a cathode, and an organic light emitting layer disposed therebetween. In the organic light emitting element, holes injected from the anode and electrons injected from the cathode are combined at the organic light emitting layer to emit light. An image may be displayed using light emitted in this manner. For example, the organic light emitting element may be configured as a single light emitting layer structure that emits one light, or may be configured as a structure that is composed of a plurality of light emitting layers to thereby emit white light. When the organic light emitting element emits white light, a color filter may be further provided therein.

The flexible substrate has excellent folding characteristics, but has a thin thickness, and has low rigidity compared to a glass substrate or a metal substrate, so it may be difficult to constantly maintain a shape thereof when folded, and accordingly, sagging thereof may occur.

In some embodiments, a back plate may be further included at a rear surface of the display panel 110. Since the flexible substrate is formed to be thin, the back plate may be attached to the rear surface of the display panel 110 to support the flexible substrate. In addition, the back plate may maintain a constant curvature of the display panel 110 when the foldable display apparatus 100 is folded, and prevent creases that may occur on an upper surface of the display panel 110.

The back plate may be formed of stainless steel (SUS) or a material having metal such as nickel (Ni), iron (Fe), aluminum (Al), or magnesium (Mg). For example, the back plate may be formed of stainless steel (SUS). For example, because stainless steel (SUS) has high restoring force and rigidity, it is possible to maintain high rigidity even if a thickness of the back plate is reduced. Accordingly, because the back plate may support the display panel 110 and at the same time, reduce an entire thickness of the foldable display apparatus 100, the radius of curvature of the folding area FA may be reduced. The back plate is not limited thereto and may be formed of a polymer such as polymethylmetacrylate (PMMA), polycarbonate (PC), polyvinylalcohol (PVA), acrylonitrile-butadiene-styrene (ABS), polyethylene terephthalate (PET), silicone, or polyurethane (PU).

The cover window 120 is disposed on the display panel 110. The cover window 120 may be a component that is exposed from an outside of the foldable display apparatus 100, and protects the display panel 110 from external impacts and scratches. Accordingly, the cover window 120 may be formed of a material that is transparent, does not cause screen distortion, and has sufficient strength even under constant pressure and repeated contact, such as a touch pen. The cover window 120 may protect the display panel 110 from moisture penetrating from the outside.

According to an embodiment of the present disclosure, a glass substrate 121 having excellent exterior characteristics and excellent rigidity and scratch resistance may be applied as the cover window 120.

Since the glass substrate 121 has a high repulsive force and a small tensile force due to the characteristics of the glass material, when a thickness of the glass substrate 121 is excessively thin, the amount of deformation thereof during an external impact may be significant. Accordingly, in a process of folding or unfolding the foldable display apparatus 100, the glass substrate 121 may be damaged by an external impact applied to the folding area FA. Further, when the thickness of the glass substrate 121 is excessively large, folding characteristics may be degraded.

Accordingly, the cover window 120 according to an embodiment of the present disclosure may include the glass substrate 121 including a plurality of grooves G at the folding area FA. The cover window 120 may include a plurality of patterns 122 disposed in the plurality of grooves G, respectively. One pattern 122 is positioned within a corresponding groove of the glass substrate 121. Accordingly, it is possible to maintain high strength and improve folding characteristics.

For example, to distribute impacts of the glass substrate 121 at the folding area FA and improve impact resistance, the glass substrate 121 may include a plurality of grooves G at the folding area FA. For example, the respective patterns 122 correspond to the shape of the respective grooves G, one pattern disposed in each of the plurality of grooves G. For example, the patterns 122 may be support patterns, impact compensation patterns, or impact compensation support patterns, but are not limited to the terms.

In other embodiments, the substrate 121 is not formed of a standard glass, but instead is comprised of a material that is somewhat more flexible, such as an epoxy resin, a printed circuit board, fiberglass impregnated with a resin or other suitable substrate.

A refractive index of the plurality of patterns 122 may be substantially the same as a refractive index of the glass substrate 121, but embodiments of the present disclosure are not limited thereto. For example, the plurality of patterns 122 may be resins having the same refractive index as the glass substrate 121. For example, the plurality of patterns 122 may be acrylic resins, but are not limited thereto.

According to an embodiment of the present disclosure, since a plurality of grooves G are disposed at the folding area FA of the glass substrate 121, the thickness of the glass substrate 121 corresponding to the folding area FA may be relatively reduced, thereby improving folding characteristics. The patterns 122 are disposed at the plurality of grooves G formed in the folding area FA of the glass substrate 121, and the shape of each of the patterns 122 corresponds to the shape of each of the plurality of grooves G. Therefore, in a process of repeatedly folding or unfolding of the foldable display apparatus 100, an impact applied to the folding area FA may be distributed.

In the cover window 120 according to an embodiment of the present disclosure, the plurality of patterns 122 that are disposed at the plurality of grooves G included at the folding area FA of the glass substrate 121 may have cross-sectional widths decreasing away from the display panel 110. Accordingly, impact resistance may be improved in the folding area FA. For example, the plurality of patterns 122 may be a plural number of patterns 122 having the above-described shape, and may have a sawtooth shape.

Since the plurality of patterns 122 are disposed at the plurality of grooves G included at the folding area FA of the glass substrate 121, in an area where the plurality of patterns 122 are disposed and an area where the plurality of patterns 122 are not disposed, for example, in an area where the grooves G are formed and an area where the grooves G are not formed in the glass substrate 121, a step of the glass substrate 121 is not a rapid step such as a right angle and may be formed in a gentle shape having a relatively inclined surface.

The glass substrate 121 is not formed with a sharp slope such as a right angle over the entirety of the folding area FA and has a gentle shape with a relatively inclined surface, so that the occurrence of cracks due to a rapid difference in thickness at the inclined surface may be prevented even in the case of repeated folding.

In addition, as the plurality of patterns 122 have a sawtooth shape, a thick portion t1 and a thin portion t2 of the glass substrate 121 may be repeated in the folding area FA.

In the folding area FA, the thick portion t1 of the glass substrate 121 has relatively excellent rigidity, and the thin portion t2 of the glass substrate 121, for example, a portion where the groove G is formed in the glass substrate 121 may have excellent ductility due to the patterns 122 formed therein. Accordingly, even if an external impact is applied in the process of folding or unfolding the foldable display apparatus 100, impact resistance may be improved in accordance with an improvement in ductility. In addition, in the process of folding or unfolding the foldable display apparatus 100, it is possible to have resistance to external impacts.

For example, as the thick portion t1 and the thin portion t2 of the glass substrate 121 are repeated in the folding area FA, the folding area FA may have improvements in all of rigidity, impact resistance, and folding characteristics.

With reference to FIG. 3 together, the glass substrate 121 includes a plurality of grooves G in the folding area FA, and the patterns 122 corresponding to the shapes of the plurality of grooves G may be disposed at the plurality of grooves G, respectively. Sizes of the patterns 122, for example, a height H, a lower width W1 and an upper width W2 of the patterns 122, and a gap K between the patterns 122 adjacent to each other are adjusted, so that a folding degree, for example, a folding margin, of the glass substrate 121, may increase.

For example, folding of the cover window 120 may be an inner folding or an outer folding.

According to an embodiment of the present disclosure, a protective layer 123 is disposed between the glass substrate 121 and the display panel 110. For example, the protective layer 123 may be disposed between the patterns 122 and the display panel 110. By the protective layer 123, steps that may exist between the glass substrate 121 and the patterns 122 and the display panel 110 are prevented, and a cross-section of the cover window 120 adjacent to the display panel 110 may be flattened.

For example, the protective layer 123 may include the same material as the patterns 122, but is not limited thereto.

Even if the glass substrate 121, the plurality of patterns 122, and the protective layer 123 are formed of materials that have substantially the same refractive index, the thickness of the glass substrate 121 has physical steps in areas where the plurality of patterns 122 are disposed within the folding area FA. For this reason, when external light is incident on the cover window 120, the incident external light may be reflected from inclined areas of the plurality of patterns 122 and the glass substrate 121, for example, the areas where the physical steps are formed, and may be emitted outwardly. Accordingly, there may be a problem that boundary areas between the glass substrate 121 and the plurality of patterns 122 are visually recognized by a user.

Accordingly, in the cover window 120 according to an embodiment of the present disclosure, each of the plurality of patterns 122 may include a plurality of protrusions CV. Accordingly, it is possible to prevent a user from visually recognizing the inclined areas of the plurality of patterns 122 and the glass substrate 121.

Each of the plurality of patterns 122 may include a lower surface A2 in contact with the protective layer 123, an upper surface A1 opposite to the lower surface, and an inclined surface A3 connecting the upper surface A1 and the lower surface A2. The plurality of protrusions CV is disposed at the inclined surface A3.

The plurality of patterns 122 include the plurality of protrusions CV, whereby light emitted from the light emitting element of the display panel 110 may be incident into the cover window 120. Light incident on the cover window 120, for example, external light, is reflected in the cover window 120 by hitting the plurality of protrusions CV, and a direction of the reflected external light is changed, thereby resulting in diffused reflection in which the reflected light is scattered.

The plurality of protrusions CV may be further disposed not only on the inclined surface A3 but also on a boundary area between the inclined surface A3 and the upper surface A1, and a boundary area between the inclined surface A3 and the lower surface A2, for example, at vertices formed by the plurality of patterns 122. For example, a boundary area between the inclined surface A3 and the lower surface A2, at vertices of the cross-section of the pattern 122 is as shown in FIG. 2.

Therefore, even in vertex areas formed by the glass substrate 121 and the plurality of patterns 122, by the plurality of protrusions CV, the external light incident on the cover window 120 hits the plurality of protrusions CV, thereby resulting in diffused reflection in which the reflected light is scattered. It is possible to more effectively prevent a user from visually recognizing the boundary area due to the scattering of the reflected light.

For example, the plurality of protrusions CV may have a circular shape, a hemispherical shape, or a partially spherical shape, but the shape thereof is not limited, as long as they have a shape capable of causing a diffused reflection effect on light incident from the outside.

According to another embodiment of the present disclosure, the protective layer includes a lower surface A2, an upper surface A1, and an inclined surface A3 between the lower surface A2 and the upper surface A1. The plurality of protrusions CV are disposed on the inclined surface A3 of the protective layer.

Various functional layers may be stacked on the cover window 120. For example, various functional layers, such as an external light reflection-reduction layer, a UV blocking layer, and a hard coating layer, may be disposed on the cover window 120, but embodiments of the present disclosure are not limited thereto.

Accordingly, according to an embodiment of the present disclosure, in the foldable display apparatus 100, the glass substrate 121 is applied as the cover window 120, and the plurality of patterns 122 are disposed at the folding area FA of the glass substrate 121 to thereby improve strength characteristics and folding characteristics. According to an embodiment of the present disclosure, since each of the plurality of patterns 122 includes a plurality of protrusions CV, external light incident on the cover window 120 hits the plurality of protrusions CV disposed at the inclined surfaces A3 of the plurality of patterns 122 and the glass substrate 121, resulting in diffused reflection in which the reflected light is scattered in various directions. Therefore, a phenomenon in which the boundary area between the glass substrate 121 and the pattern 122 is visually recognized by the user is reduced, thereby improving product reliability. According to an embodiment of the present disclosure, since each of the plurality of patterns 122 includes a plurality of protrusions CV, the diffused reflection effect is increased when external light is reflected, so that the visibility of the boundary area between the glass substrate 121 and the pattern 122 may be reduced, thereby improving product reliability and/or product completeness.

Figure 4:
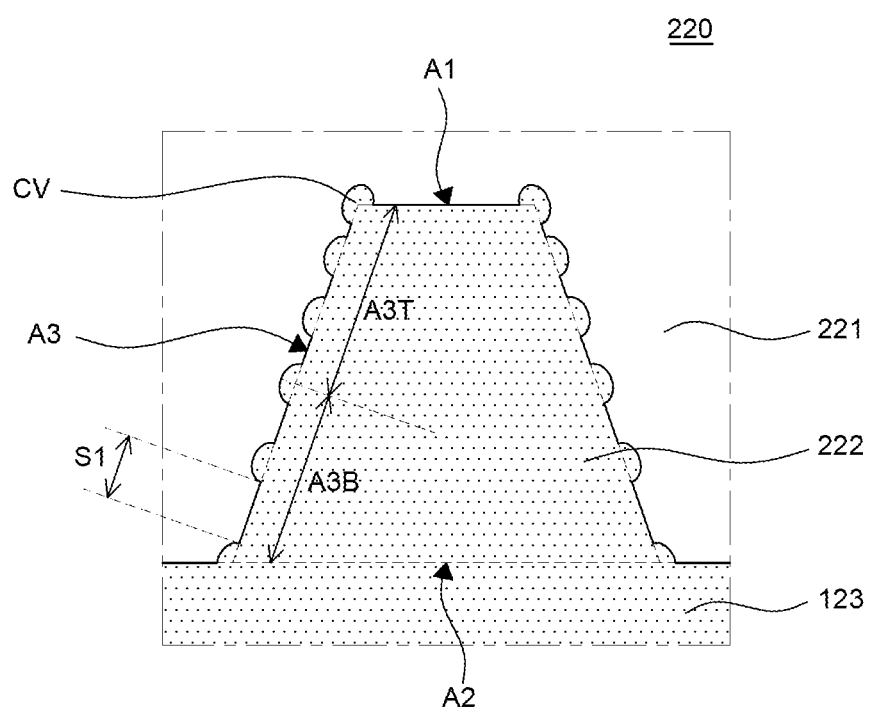
FIG. 4 is a cross-sectional view of a cover window according to another embodiment of the present disclosure.

FIG. 4 is a cross-sectional view of a cover window according to another embodiment of the present disclosure. The cover window shown in FIG. 4 is substantially the same as the cover window shown in FIGS. 1 to 3 except for a difference in density of areas where a plurality of protrusions CV are disposed, and thus, a redundant description may be omitted.

A density (or concentration) of the plurality of protrusions CV that are disposed at inclined surfaces A3 of a plurality of patterns 220 disposed at the folding area FA of a cover window 220 according to another embodiment of the present disclosure may increase in a direction toward the upper surface.

For example, in the cover window 220 according to another embodiment of the present disclosure, the inclined surface A3 of each of the plurality of patterns 220 disposed at the folding area FA may include an upper inclined surface A3T extending from an upper surface A1 and a lower inclined surface A3B extending from a lower surface A2.

The density of the plurality of protrusions CV disposed at the upper inclined surface A3T may be higher than the density of the plurality of protrusions CV disposed at the lower inclined surface A3B.

For example, a boundary between the upper inclined surface A3T and the lower inclined surface A3B may correspond to a center of the inclined surface A3.

When external light incident on the cover window 220 from the outside is reflected on inclined areas of the glass substrate 221 and the plurality of patterns 222, and the reflected light is visually recognized by a user, visibility of the upper inclined surface A3T having a relatively short path through which the reflected light is emitted is higher than visibility of the lower inclined surface A3B.

For example, in the pattern 222, the density of the plurality of protrusions CV disposed at the upper inclined surface A3T with relatively high visibility is higher than the density of the plurality of protrusions CV disposed at the lower inclined surface A3B, so that the light incident at the upper inclined surface A3T hits the plurality of protrusions CV disposed at high density to thereby more easily scatter the reflected light.

Therefore, according to another embodiment of the present disclosure, each of the plurality of patterns 222 includes the plurality of protrusions CV, and the density of the protrusions CV is configured differently depending on areas of the inclined surfaces, so that it is possible to more effectively prevent a phenomenon in which the boundary area between the glass substrate 221 and the pattern 222 is visually recognized, thereby improving product completeness and/or product reliability.

According to another embodiment of the present disclosure, since the plurality of patterns 222 includes the plurality of protrusions CV, the plurality of protrusions easily scatter light incident from the outside. Thereby, it is possible to effectively prevent the boundary area between the glass substrate 221 and the pattern 222 from being visually recognized. However, when scattering of the reflected light does not occur enough even if the incident light hits the plurality of protrusions CV, the plurality of protrusions CV may be visually recognized by a user since the plurality of protrusions CV are disposed at the inclined areas of the glass substrate 221 and the pattern 222.

Accordingly, according to another embodiment of the present disclosure, sizes of the plurality of protrusions CV included at the plurality of patterns 222 or a distance s1 between the protrusions CV adjacent to each other may be adjusted. Accordingly, it is possible to prevent a user from visually recognizing the boundary area between the glass substrate 221 and the pattern 222 and the plurality of protrusions CV existing on the boundary area.

Figure 5:
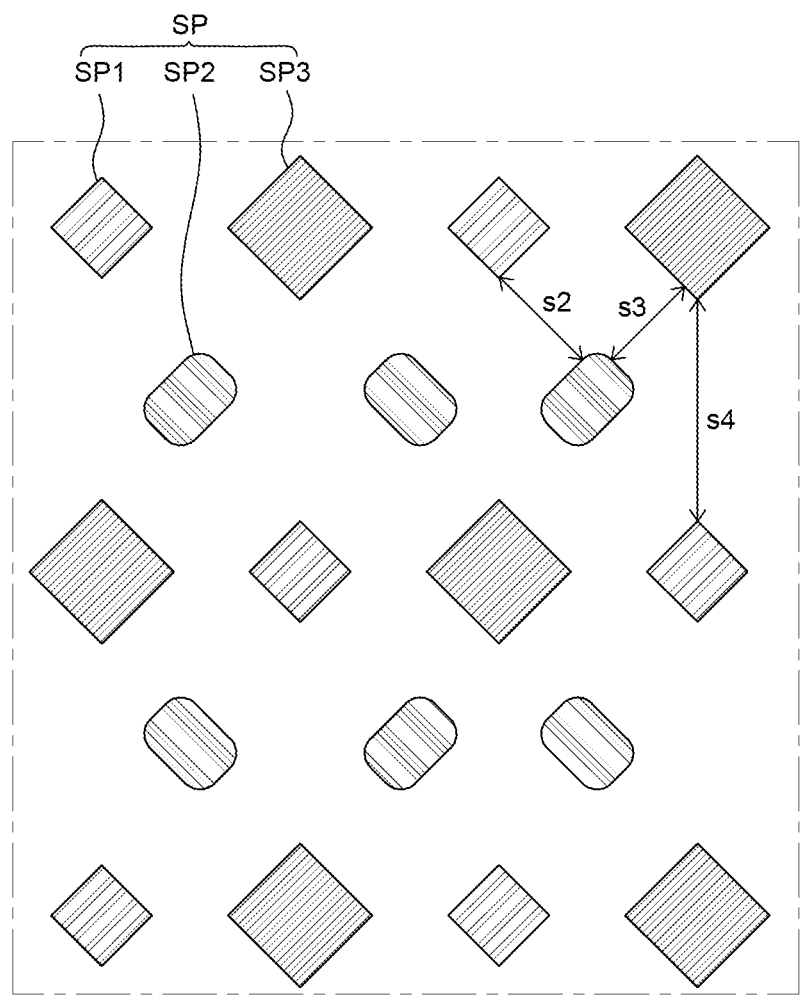
FIG. 5 is an enlarged plan view of a display apparatus according to another embodiment of the present disclosure.

With reference to FIG. 5 together, a plurality of sub-pixels SP are individual units that emit light, and a light emitting element may be disposed in each of the plurality of sub-pixels SP. The plurality of sub-pixels SP includes first sub-pixels SP1, second sub-pixels SP2, and third sub-pixels SP3 that emit light of different colors. For example, the first sub-pixel SP1 may be a red sub-pixel, the second sub-pixel SP2 may be a green sub-pixel, and the third sub-pixel SP3 may be a blue sub-pixel.

The plurality of first sub-pixels SP1 and the plurality of third sub-pixels SP3 may be alternately disposed in the same columns or in the same rows. For example, the first sub-pixels SP1 and the third sub-pixels SP3 may be alternately disposed in the same columns, and the first sub-pixels SP1 and the third sub-pixels SP3 may be alternately disposed in the same rows.

The plurality of second sub-pixels SP2 are disposed in different columns and different rows from the plurality of first sub-pixels SP1 and the plurality of third sub-pixels SP3. For example, the plurality of second sub-pixels SP2 may be disposed in one row, and the plurality of first sub-pixels SP1 and the plurality of third sub-pixels SP3 may be alternately disposed in a row adjacent to the one row. The plurality of second sub-pixels SP2 may be disposed in one column, and the plurality of first sub-pixels SP1 and the plurality of third sub-pixels SP3 may be alternately disposed in a column adjacent to the one column. The plurality of first sub-pixels SP1 and the second sub-pixels SP2 may face each other in a diagonal direction, and the plurality of third sub-pixels SP3 and the second sub-pixels SP2 may also face each other in a diagonal direction. Accordingly, the plurality of sub-pixels SP may be disposed in a lattice shape.

In FIG. 5, it is illustrated that the plurality of first sub-pixels SP1 and the plurality of third sub-pixels SP3 are disposed in the same columns and the same rows, and the plurality of second sub-pixels SP2 are disposed in different columns and different rows from the plurality of first sub-pixels SP1 and the plurality of third sub-pixels SP3, but an arrangement of the plurality of sub-pixels SP is not limited thereto.

In the present disclosure, although it has been described that the plurality of sub-pixels SP include the first sub-pixels SP1, the second sub-pixels SP2, and the third sub-pixels SP3, the arrangement, number and color combinations of the plurality of sub-pixels SP may be variously changed according to design, but are not limited thereto.

As described above, the light emitting element is disposed in each of the plurality of sub-pixels SP, and different light emitting layers are respectively disposed in the first sub-pixel SP1, the second sub-pixel SP2, and the third sub-pixel SP3. Alternatively, the same light emitting layer may be disposed in all of the plurality of sub-pixels SP. For example, when different light emitting layers are respectively disposed in the plurality of sub-pixels, a red light emitting layer is disposed in the first sub-pixel SP1, a green light emitting layer is disposed in the second sub-pixel SP2, and a blue light emitting layer may be disposed in the third sub-pixel SP3. For example, when the same light emitting layer is disposed over the plurality of sub-pixels SP, light emitted from the light emitting layer may be converted into light of various colors through a separate light conversion layer, a color filter or the like.

The plurality of sub-pixels SP included in the display panel 110 may be minimum units that are not visually recognized by a user.

Accordingly, according to another embodiment of the present disclosure, when a size of each of the plurality of protrusions CV included at the plurality of patterns 222 is smaller than those of the plurality of sub-pixels SP, it is possible to easily prevent a phenomenon in which the boundary area between the glass substrate 221 and the pattern 222 and the plurality of protrusions CV existing in the boundary area are visually recognized.

For example, when the size of each of the plurality of protrusions CV included at the plurality of patterns 222 is smaller than a size of a smallest sub-pixel SP among the plurality of sub-pixels SP, or when a distance s1 between the protrusions CV adjacent that are included at the plurality of patterns 222 is shorter than distances s2, s3, and s4 of two sub-pixels having the smallest distances among the plurality of sub-pixels SP, the plurality of protrusions CV included at the plurality of patterns 222 may also not be visually recognized by a user.

Therefore, according to another embodiment of the present disclosure, the size of the plurality of protrusions CV disposed at the plurality of patterns 222 and the distance s1 between the adjacent protrusions CV are adjusted, so that it is possible to prevent a phenomenon in which the boundary area between the glass substrate 221 and the pattern 222 and the plurality of protrusions CV disposed at the boundary area are visually recognized, thereby leading to improvements in product completeness and/or product reliability.

A display apparatus according to an embodiment of the present disclosure will be described below.

According to an embodiment of the present disclosure, a foldable display apparatus comprises a display panel including a folding area and a non-folding area at one or more sides of the folding area, and a cover window on the display panel. The cover window includes a glass substrate including a plurality of patterns at the folding area, and a protective layer between the glass substrate and the display panel. Each of the plurality of patterns includes a plurality of protrusions.

According to some embodiments of the present disclosure, each of the plurality of protrusions may include either a hemispherical shape, or a partially spherical shape.

According to some embodiments of the present disclosure, each of the plurality of patterns may have a cross-sectional width decreasing away from the display panel.

According to some embodiments of the present disclosure, each of the plurality of patterns may include a lower surface in contact with the protective layer, an upper surface opposite to the lower surface, and an inclined surface connecting the upper surface and the lower surface. The plurality of protrusions may be disposed at the inclined surface.

According to some embodiments of the present disclosure, the plurality of protrusions may be further disposed at a boundary area between the inclined surface and the upper surface and a boundary area between the inclined surface and the lower surface.

According to some embodiments of the present disclosure, a density of the plurality of protrusions disposed at the inclined surface may increase in a direction toward the upper surface.

According to some embodiments of the present disclosure, the inclined surface may include an upper inclined surface extending from the upper surface, and a lower inclined surface extending from the lower surface. A density of the plurality of protrusions disposed at the upper inclined surface may be higher than a density of the plurality of protrusions disposed at the lower inclined surface.

According to some embodiments of the present disclosure, a boundary between the upper inclined surface and the lower inclined surface may correspond to a center of the inclined surface.

According to some embodiments of the present disclosure, a distance between the plurality of protrusions at the lower inclined surface may be shorter than a distance between two sub-pixels having a smallest distance among a plurality of sub-pixels in the display panel.

According to some embodiments of the present disclosure, a size of each of the plurality of protrusions may be smaller than a size of a sub-pixel having a smallest size among a plurality of sub-pixels in the display panel.

According to some embodiments of the present disclosure, a refractive index of the plurality of patterns may be substantially the same as a refractive index of the glass substrate.

According to some embodiments of the present disclosure, the glass substrate may be disposed at the folding area.

According to an embodiment of the present disclosure, a foldable display apparatus comprises a display panel including a display area having a plurality of sub-pixels, a non-display area adjacent to the display area, a folding area in the display area and the non-display area, and a non-folding area at one or more sides of the folding area, and a cover window at the display panel. The cover window comprises a substrate including a plurality of grooves at the folding area, a plurality of patterns at the plurality of grooves, the plurality of patterns corresponding to the plurality of grooves, and a plurality of protrusions on each of the plurality of patterns.

According to some embodiments of the present disclosure, each of the plurality of patterns may include a lower surface, an upper surface, and an inclined surface between the lower surface and the upper surface, and the plurality of protrusions may be disposed on the inclined surface.

According to some embodiments of the present disclosure, a density of the plurality of protrusions disposed at the inclined surface may increase in a direction toward the upper surface.

According to some embodiments of the present disclosure, each of the plurality of protrusions may have a circular shape.

According to some embodiments of the present disclosure, a size of each of the plurality of protrusions may be smaller than a size of a sub-pixel having a smallest size among the plurality of sub-pixels.

According to some embodiments of the present disclosure, the plurality of sub-pixels may include a first sub-pixel, a second sub-pixel, and a third sub-pixel. A distance between adjacent protrusions may be smaller than a distance between the first sub-pixel and the second sub-pixel.

According to some embodiments of the present disclosure, the plurality of sub-pixels may include a first sub-pixel, a second sub-pixel, and a third sub-pixel. A distance between adjacent protrusions may be smaller than a distance between the second sub-pixel and the third sub-pixel.

According to some embodiments of the present disclosure, the plurality of sub-pixels may include a first sub-pixel, a second sub-pixel, and a third sub-pixel. A distance between adjacent protrusions may be smaller than a distance between the first sub-pixel and the third sub-pixel.

According to an embodiment of the present disclosure, a foldable display apparatus comprises a display panel divided into a display area having a plurality of sub-pixels, a non-display area adjacent to the display area, and also divided into a folding area across the display area and the non-display area, and a non-folding area at one or more sides of the folding area, and a cover window on the display panel. The cover window comprises a glass substrate including a plurality of grooves at the folding area, a plurality of patterns at the plurality of grooves, and a protective layer between the glass substrate and the display panel. Each of the plurality of patterns includes a plurality of protrusions.

According to some embodiments of the present disclosure, each of the plurality of patterns may include a lower surface, an upper surface, and an inclined surface between the lower surface and the upper surface, and the plurality of protrusions may be disposed on the inclined surface.

According to some embodiments of the present disclosure, a density of the plurality of protrusions disposed on the inclined surface may increase in a direction toward the upper surface.

According to some embodiments of the present disclosure, a size of each of the plurality of protrusions may be smaller than a size of a sub-pixel having a smallest size among the plurality of sub-pixels.

According to some embodiments of the present disclosure, the plurality of sub-pixels may include a first sub-pixel, a second sub-pixel, and a third sub-pixel. A distance between adjacent protrusions may be smaller than a distance between the first sub-pixel and the second sub-pixel.

According to some embodiments of the present disclosure, the plurality of sub-pixels may include a first sub-pixel, a second sub-pixel, and a third sub-pixel. A distance between adjacent protrusions may be smaller than a distance between the second sub-pixel and the third sub-pixel.

According to some embodiments of the present disclosure, the plurality of sub-pixels may include a first sub-pixel, a second sub-pixel, and a third sub-pixel. A distance between adjacent protrusions may be smaller than a distance between the first sub-pixel and the third sub-pixel.

It will be apparent to those skilled in the art that various modifications and variations can be made in the present disclosure without departing from the technical idea or scope of the disclosures. Thus, it may be intended that embodiments of the present disclosure cover the modifications and variations of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A foldable display apparatus, comprising:
a display panel including a folding area and a non-folding area at one or more sides of the folding area; and
a cover window on the display panel,
wherein the cover window includes:
a glass substrate including a plurality of patterns at the folding area; and
a protective layer between the glass substrate and the display panel,
wherein each of the plurality of patterns includes a plurality of protrusions.

2. The foldable display apparatus of claim 1, wherein each of the plurality of protrusions has either a hemispherical shape or a partially spherical shape.

3. The foldable display apparatus of claim 1, wherein each of the plurality of patterns has a cross-sectional width decreasing away from the display panel.

4. The foldable display apparatus of claim 1, wherein each of the plurality of patterns includes a lower surface in contact with the protective layer, an upper surface opposite to the lower surface, and an inclined surface connecting the upper surface and the lower surface,
wherein the plurality of protrusions are disposed at the inclined surface.

5. The foldable display apparatus of claim 4, wherein the plurality of protrusions are further disposed at a boundary area between the inclined surface and the upper surface and a boundary area between the inclined surface and the lower surface.

6. The foldable display apparatus of claim 4, wherein a density of the plurality of protrusions disposed at the inclined surface increases in a direction toward the upper surface.

7. The foldable display apparatus of claim 4, wherein the inclined surface includes an upper inclined surface extending from the upper surface, and a lower inclined surface extending from the lower surface,
wherein a density of the plurality of protrusions disposed at the upper inclined surface is higher than a density of the plurality of protrusions disposed at the lower inclined surface.

8. The foldable display apparatus of claim 7, wherein a boundary between the upper inclined surface and the lower inclined surface corresponds to a center of the inclined surface.

9. The foldable display apparatus of claim 7, wherein a distance between the plurality of protrusions at the lower inclined surface is shorter than a distance between two sub-pixels having a smallest distance among a plurality of sub-pixels in the display panel.

10. The foldable display apparatus of claim 1, wherein a size of each of the plurality of protrusions is smaller than a size of a sub-pixel having a smallest size among a plurality of sub-pixels in the display panel.

11. The foldable display apparatus of claim 1, wherein a refractive index of the plurality of patterns is substantially the same as a refractive index of the glass substrate.

12. The foldable display apparatus of claim 1, wherein the glass substrate is disposed at the folding area.

13. A foldable display apparatus, comprising:
a display panel including a display area having a plurality of sub-pixels, a non-display area adjacent to the display area, a folding area in the display area and the non-display area, and a non-folding area at one or more sides of the folding area; and
a cover window at the display panel, the cover window comprising:
a substrate including a plurality of grooves at the folding area;
a plurality of patterns at the plurality of grooves, the plurality of patterns corresponding to the plurality of grooves; and
a plurality of protrusions on each of the plurality of patterns.

14. The foldable display apparatus of claim 13,
wherein each of the plurality of patterns includes a lower surface, an upper surface, and an inclined surface between the lower surface and the upper surface, and the plurality of protrusions are disposed on the inclined surface.

15. The foldable display apparatus of claim 14, wherein a density of the plurality of protrusions disposed at the inclined surface increases in a direction toward the upper surface.

16. The foldable display apparatus of claim 13, wherein each of the plurality of protrusions includes a circular shape.

17. The foldable display apparatus of claim 13, wherein a size of each of the plurality of protrusions is smaller than a size of a sub-pixel having a smallest size among the plurality of sub-pixels.

18. The foldable display apparatus of claim 13, wherein the plurality of sub-pixels include a first sub-pixel, a second sub-pixel, and a third sub-pixel, and wherein a distance between adjacent protrusions is smaller than a distance between the first sub-pixel and the second sub-pixel.

19. The foldable display apparatus of claim 13, wherein the plurality of sub-pixels include a first sub-pixel, a second sub-pixel, and a third sub-pixel, and wherein a distance between adjacent protrusions is smaller than a distance between the second sub-pixel and the third sub-pixel.

20. The foldable display apparatus of claim 13, wherein the plurality of sub-pixels include a first sub-pixel, a second sub-pixel, and a third sub-pixel, and wherein a distance between adjacent protrusions is smaller than a distance between the first sub-pixel and the third sub-pixel.

21. A foldable display apparatus, comprising:
a display panel divided into a display area having a plurality of sub-pixels and a non-display area adjacent to the display area, and also divided into a folding area across the display area and the non-display area, and a non-folding area at one or more sides of the folding area; and
a cover window on the display panel,
wherein the cover window includes:
a glass substrate including a plurality of grooves at the folding area;
a plurality of patterns at the plurality of grooves; and
a protective layer between the glass substrate and the display panel,
wherein each of the plurality of patterns includes a plurality of protrusions.

22. The foldable display apparatus of claim 21, wherein each of the plurality of patterns includes a lower surface, an upper surface, and an inclined surface between the lower surface and the upper surface, and the plurality of protrusions are disposed on the inclined surface.

23. The foldable display apparatus of claim 22, wherein a density of the plurality of protrusions disposed on the inclined surface increases in a direction toward the upper surface.

24. The foldable display apparatus of claim 21, wherein a size of each of the plurality of protrusions is smaller than a size of a sub-pixel having a smallest size among the plurality of sub-pixels.

25. The foldable display apparatus of claim 21, wherein the plurality of sub-pixels include a first sub-pixel, a second sub-pixel, and a third sub-pixel, and wherein a distance between adjacent protrusions is smaller than a distance between the first sub-pixel and the second sub-pixel.

26. The foldable display apparatus of claim 21, wherein the plurality of sub-pixels include a first sub-pixel, a second sub-pixel, and a third sub-pixel, and wherein a distance between adjacent protrusions is smaller than a distance between the second sub-pixel and the third sub-pixel.

27. The foldable display apparatus of claim 21, wherein the plurality of sub-pixels include a first sub-pixel, a second sub-pixel, and a third sub-pixel, and wherein a distance between adjacent protrusions is smaller than a distance between the first sub-pixel and the third sub-pixel.

* * * * *